US012471461B2

(12) United States Patent
Liu

(10) Patent No.: US 12,471,461 B2
(45) Date of Patent: Nov. 11, 2025

(54) DISPLAY SUBSTRATE INCLUDING A RESET SIGNAL LINE AND AN INITIALIZATION SIGNAL LINE AND DISPLAY DEVICE HAVING THE SAME

(71) Applicants: Chengdu BOE Optoelectronics Technology Co., Ltd., Sichuan (CN); BOE Technology Group Co., Ltd., Beijing (CN)

(72) Inventor: Guo Liu, Beijing (CN)

(73) Assignees: Chengdu BOE Optoelectronics Technology Co., Ltd., Sichuan (CN); Beijing BOE Technology Developement Co., Ltd., Beijing (CN)

( * ) Notice: Subject to any disclaimer, the term of this patent is extended or adjusted under 35 U.S.C. 154(b) by 566 days.

(21) Appl. No.: 17/909,418

(22) PCT Filed: Oct. 22, 2021

(86) PCT No.: PCT/CN2021/125811
§ 371 (c)(1),
(2) Date: Sep. 5, 2022

(87) PCT Pub. No.: WO2022/111172
PCT Pub. Date: Jun. 2, 2022

(65) Prior Publication Data

US 2023/0097504 A1 Mar. 30, 2023

(30) Foreign Application Priority Data

Nov. 25, 2020 (CN) ......................... 202011337907.9

(51) Int. Cl.
*H10K 59/13* (2023.01)
*G09G 3/3233* (2016.01)
*H10K 59/131* (2023.01)

(52) U.S. Cl.
CPC ......... *H10K 59/131* (2023.02); *G09G 3/3233* (2013.01); *G09G 2300/0819* (2013.01);
(Continued)

(58) Field of Classification Search
CPC ............... H10K 59/131; G09G 3/3233; G09G 2300/0819; G09G 2300/0842
(Continued)

(56) References Cited

U.S. PATENT DOCUMENTS

2017/0200417 A1 7/2017 Wu et al.
2018/0012548 A1 1/2018 Koh
(Continued)

FOREIGN PATENT DOCUMENTS

CN 104008723 A 8/2014
CN 106782313 A 5/2017
(Continued)

OTHER PUBLICATIONS

Cite the machine translation Chen Y (CN-111477669-A).*
PCT/CN2021/125811 international search report and written opinion.

*Primary Examiner* — Phuc T Dang
(74) *Attorney, Agent, or Firm* — IPro, PLLC

(57) ABSTRACT

The present disclosure provides a display substrate, and a display device. The display substrate includes a base substrate and a plurality of sub-pixels arranged on the base substrate; the sub-pixels include: a reset signal line, at least a part of the reset signal line extending along a first direction; an initialization signal line, at least a part of the initialization signal line extending along the first direction; a first transistor, a gate electrode of the first transistor being coupled to the reset signal line, a first electrode of the first transistor being coupled to the initialization signal line, an orthographic projection of at least part of the first electrode
(Continued)

of the first transistor on the base substrate being located between an orthographic projection of the reset signal line on the base substrate and an orthographic projection of the initialization signal line on the base substrate.

20 Claims, 12 Drawing Sheets

(52) U.S. Cl.
CPC ............... *G09G 2300/0842* (2013.01); *G09G 2310/0297* (2013.01)

(58) Field of Classification Search
USPC ............................................................ 257/72
See application file for complete search history.

(56) References Cited

U.S. PATENT DOCUMENTS

| | | | | |
|---|---|---|---|---|
| 2021/0193780 | A1 * | 6/2021 | Diao | H10K 59/1201 |
| 2022/0336542 | A1 | 10/2022 | Chen et al. | |
| 2022/0336566 | A1 | 10/2022 | Chen et al. | |
| 2022/0367596 | A1 | 11/2022 | Chen et al. | |

FOREIGN PATENT DOCUMENTS

| | | | | | |
|---|---|---|---|---|---|
| CN | 111462695 | A | | 7/2020 | |
| CN | 111463255 | A | | 7/2020 | |
| CN | 111477669 | A | * | 7/2020 | G09G 3/3225 |
| CN | 111508977 | A | | 8/2020 | |
| CN | 112436042 | A | | 3/2021 | |

* cited by examiner

DISPLAY SUBSTRATE INCLUDING A RESET SIGNAL LINE AND AN INITIALIZATION SIGNAL LINE AND DISPLAY DEVICE HAVING THE SAME

CROSS-REFERENCE TO RELATED APPLICATION

This application is the U.S. national phase of PCT Application No. PCT/CN2021/125811 filed on Oct. 22, 2021, which claims a priority of the Chinese patent application No. 202011337907.9 filed on Nov. 25, 2020, which is incorporated herein by reference in its entirety.

TECHNICAL FIELD

The present disclosure relates to the field of display technology, in particular to a display substrate and a display device.

BACKGROUND

Organic Light-Emitting Diode (OLED) display devices are widely used in various fields due to their high brightness, low power consumption, fast response, high definition, good flexibility and high luminous efficiency.

When an OLED display device is applied to an under-screen sensor product with transmittance requirements, if the transmittance of the OLED display device does not meet the standard, it may lead to poor functionality of the sensor product.

SUMMARY

An object of the present disclosure is to provide a display substrate and a display device.

In order to achieve the above object, the present disclosure provides the following technical solutions.

In one aspect, the present disclosure provides in some embodiments a display substrate, including: a base substrate and a plurality of sub-pixels arranged on the base substrate; wherein the sub-pixels include: a reset signal line, at least a part of the reset signal line extending along a first direction; an initialization signal line, at least a part of the initialization signal line extending along the first direction; a first transistor, a gate electrode of the first transistor being coupled to the reset signal line, a first electrode of the first transistor being coupled to the initialization signal line, an orthographic projection of at least part of the first electrode of the first transistor on the base substrate being located between an orthographic projection of the reset signal line on the base substrate and an orthographic projection of the initialization signal line on the base substrate.

Optionally, the sub-pixel further comprises a conductive connection portion, and the conductive connection portion is respectively coupled to the first electrode of the first transistor and the initialization signal line, an orthographic projection of the conductive connection portion on the base substrate is located between the orthographic projection of the reset signal line on the base substrate and the orthographic projection of the initialization signal line on the base substrate; a length of the conductive connection portion along the second direction is smaller than a distance between the orthographic projection of the reset signal line on the base substrate and the orthographic projection of the initialization signal line on the base substrate.

Optionally, the orthographic projection of the conductive connection portion on the base substrate does not overlap the orthographic projection of the reset signal line on the base substrate.

Optionally, the orthographic projection of the first electrode of the first transistor on the base substrate partially overlaps the orthographic projection of the initialization signal line on the base substrate.

Optionally, the initialization signal line includes a main body and a protrusion portion, and the main body extends along the first direction, an orthographic projection of the protrusion portion on the base substrate at least partially overlaps the orthographic projection of the first electrode of the first transistor on the base substrate.

Optionally, the sub-pixel further comprises a gate line, at least a part of the gate line extends along the first direction; the orthographic projection of the initialization signal line on the base substrate is located between the orthographic projection of the reset signal line on the base substrate and an orthographic projection of the gate line on the base substrate.

Optionally, the sub-pixel further includes a second transistor, a gate electrode of the second transistor is coupled to the gate line, a first electrode of the second transistor is coupled to a second electrode of a driving transistor, and a second electrode of the second transistor is coupled to a gate electrode of the driving transistor.

Optionally, the orthographic projection of the initialization signal line on the base substrate at least partially overlaps an orthographic projection of a gate electrode of a second transistor on the base substrate.

Optionally, the second transistor includes a second active pattern, and the second active pattern includes a conductor portion and two semiconductor portions, the conductor portion is respectively coupled to the two semiconductor portions; the sub-pixel further includes a shielding pattern, the shielding pattern is coupled to the initialization signal line, and an orthographic projection of the shielding pattern on the base substrate at least partially overlaps an orthographic projection of the conductor portion on the base substrate.

Optionally, the shielding pattern and the initialization signal line are formed as an integrated structure.

Optionally, the shielding pattern includes a first sub-pattern and a second sub-pattern, and the first sub-pattern extends along the second direction, the second direction intersects the first direction, the second sub-pattern extends along the first direction, and an orthographic projection of the second sub-pattern on the base substrate at least partially overlaps the orthographic projection of the conductor portion on the base substrate.

Optionally, the sub-pixel further includes a light-emitting element and a seventh transistor, and a gate electrode of the seventh transistor is coupled to a reset signal line in a next sub-pixel adjacent along the second direction, a first electrode of the seventh transistor is coupled to an initialization signal line in the next sub-pixel adjacent along the second direction, a second electrode of the seventh transistor is coupled to the light-emitting element, and the second direction intersects the first direction; an orthographic projection of the first electrode of the seventh transistor on the base substrate is located between an orthographic projection of the reset signal line in the next sub-pixel adjacent along the second direction on the base substrate and an orthographic projections of the initialization signal line in the next sub-pixel adjacent along the second direction on the base substrate.

Optionally, the first electrode of the seventh transistor and a first electrode of the first transistor in the next sub-pixel adjacent to the second direction are formed as an integrated structure.

Optionally, the sub-pixel further includes: a light-emitting control signal line, at least a part of the light-emitting control signal line extending along the first direction; a power supply line, at least a part of the power supply line extending along the second direction; a data line, at least a part of the data line extending along the second direction; a fourth transistor, wherein a gate electrode of the fourth transistor is coupled to the gate line, a first electrode of the fourth transistor is coupled to the data line, a second electrode of the fourth transistor is coupled to the first electrode of the driving transistor; a fifth transistor, wherein a gate electrode of the fifth transistor is coupled to the light-emitting control signal line, a first electrode of the fifth transistor is coupled to the power line, a second electrode of the fifth transistor is coupled to the first electrode of the driving transistor; a sixth transistor, wherein a gate electrode of the sixth transistor is coupled to the light-emitting control signal line, a first electrode of the sixth transistor is coupled to the second electrode of the driving transistor, and a second electrode of the sixth transistor is coupled to the light-emitting element; a storage capacitor, wherein the gate electrode of the driving transistor is multiplexed as a first electrode plate of the storage capacitor, and a second electrode plate of the storage capacitor is coupled to the power line.

In another aspect, the present disclosure provides in some embodiments a display device including the above-mentioned display substrate.

BRIEF DESCRIPTION OF THE DRAWINGS

The accompanying drawings described herein are used to provide further understanding of the present disclosure and constitute a part of the present disclosure. The exemplary embodiments of the present disclosure and their descriptions are used to explain the present disclosure and do not constitute an improper limitation of the present disclosure.

DETAILED DESCRIPTION

In order to further illustrate the display substrate and the display device provided by the embodiments of the present disclosure, a detailed description is given below with reference to the accompanying drawings.

Figure 1:
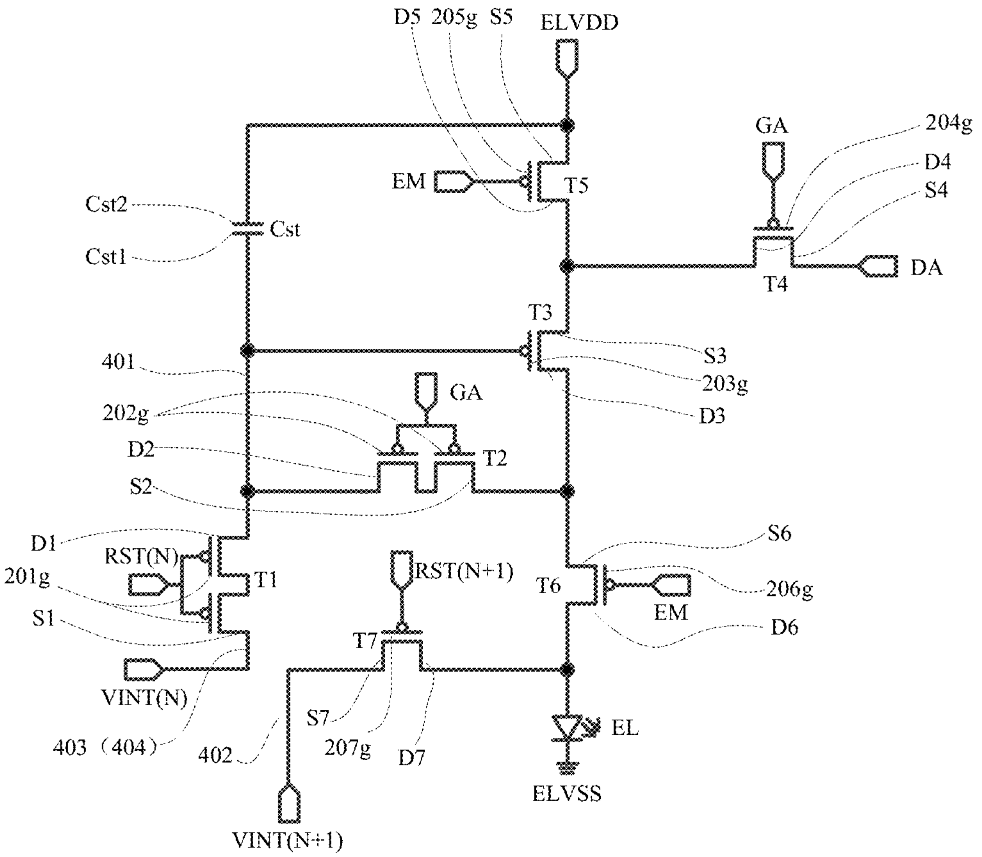
FIG. 1 is a schematic structural diagram of a sub-pixel driving circuit provided by an embodiment of the present disclosure.
Figure 3:
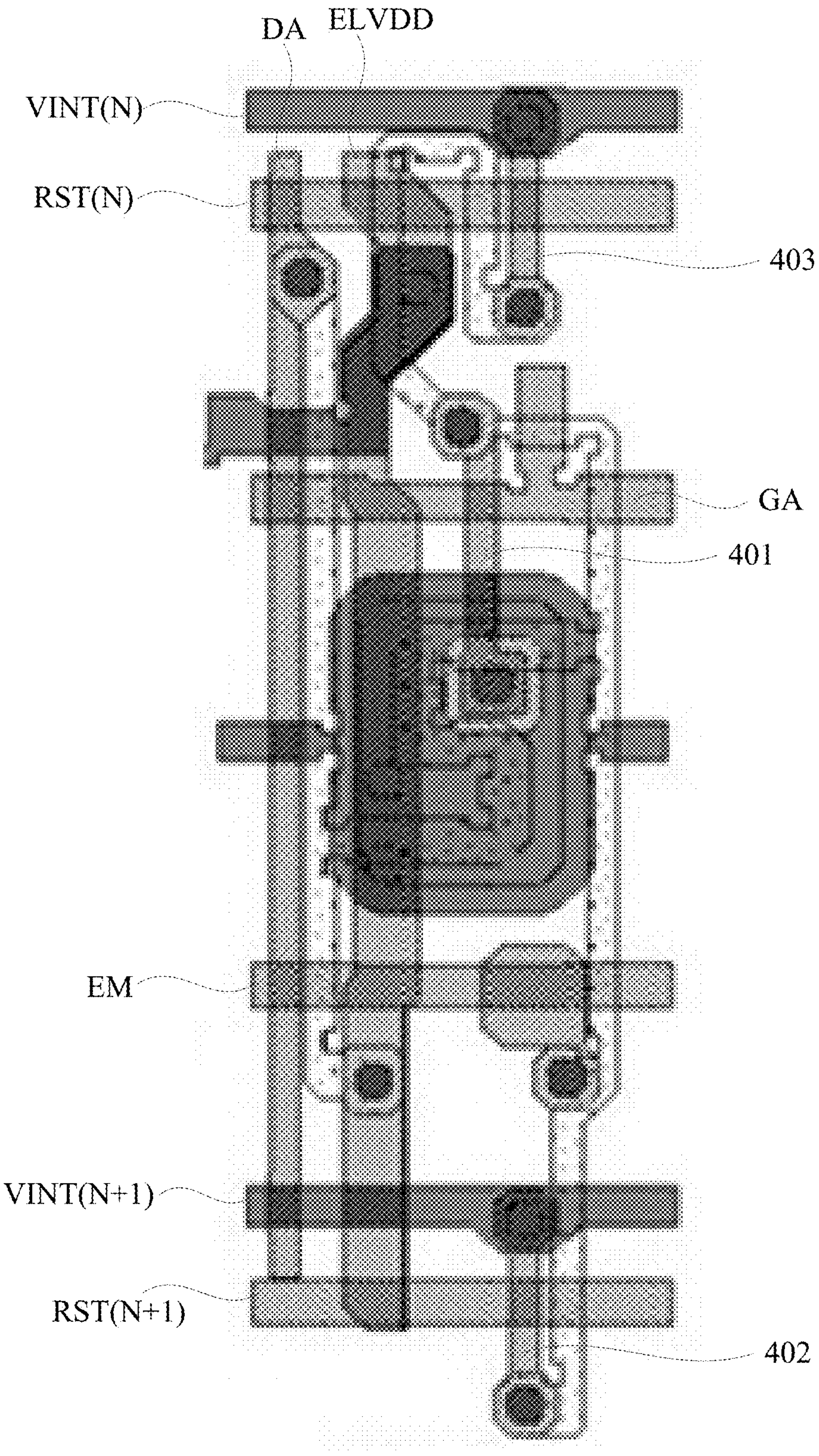
FIG. 3 is a first layout flowchart of the sub-pixel driving circuit in FIG. 1.
Figure 5:
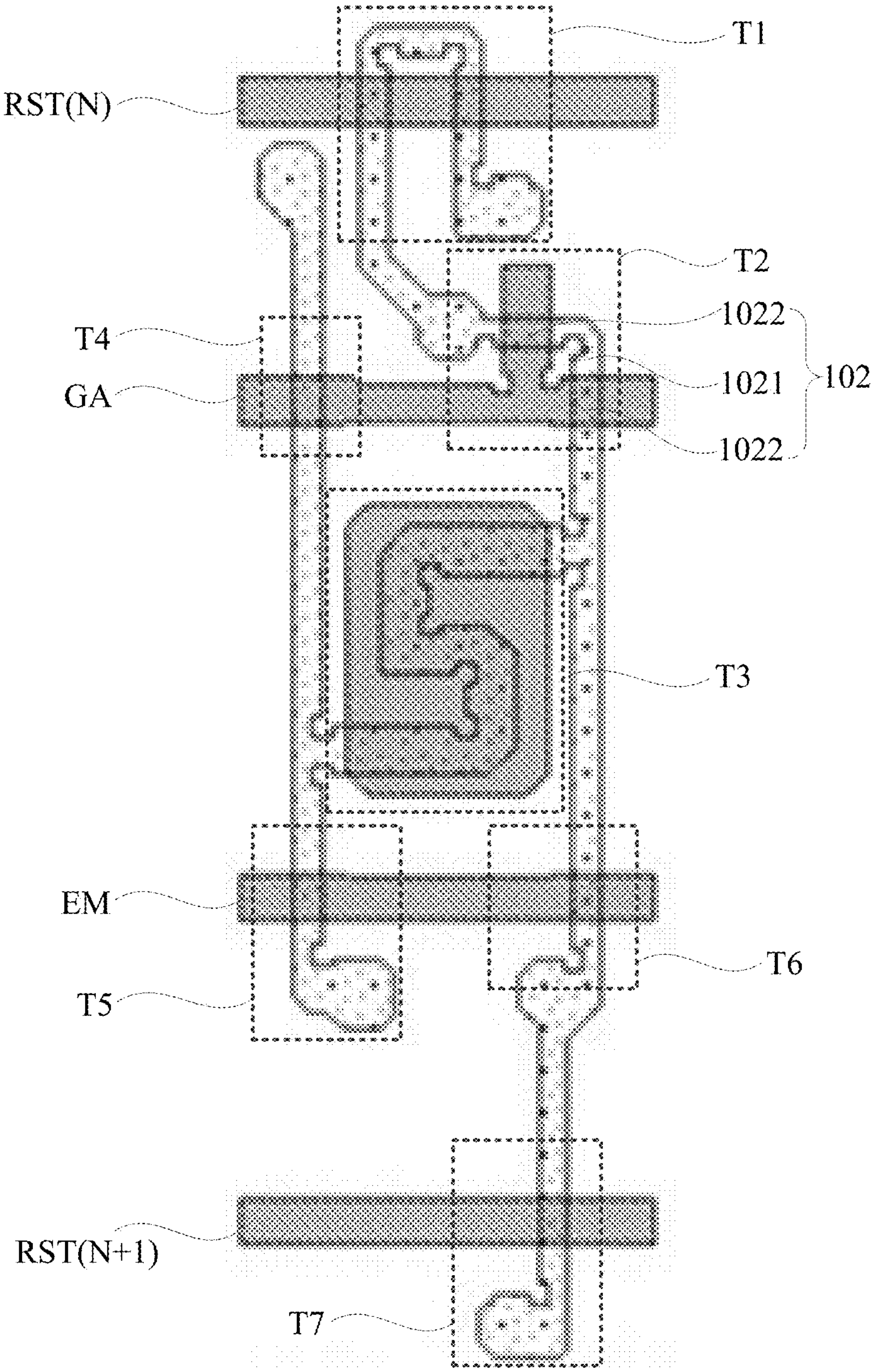
FIG. 5 is a schematic diagram of the layout of the active layer and the first gate metal layer in FIGS. 1 and 2.
Figure 6:
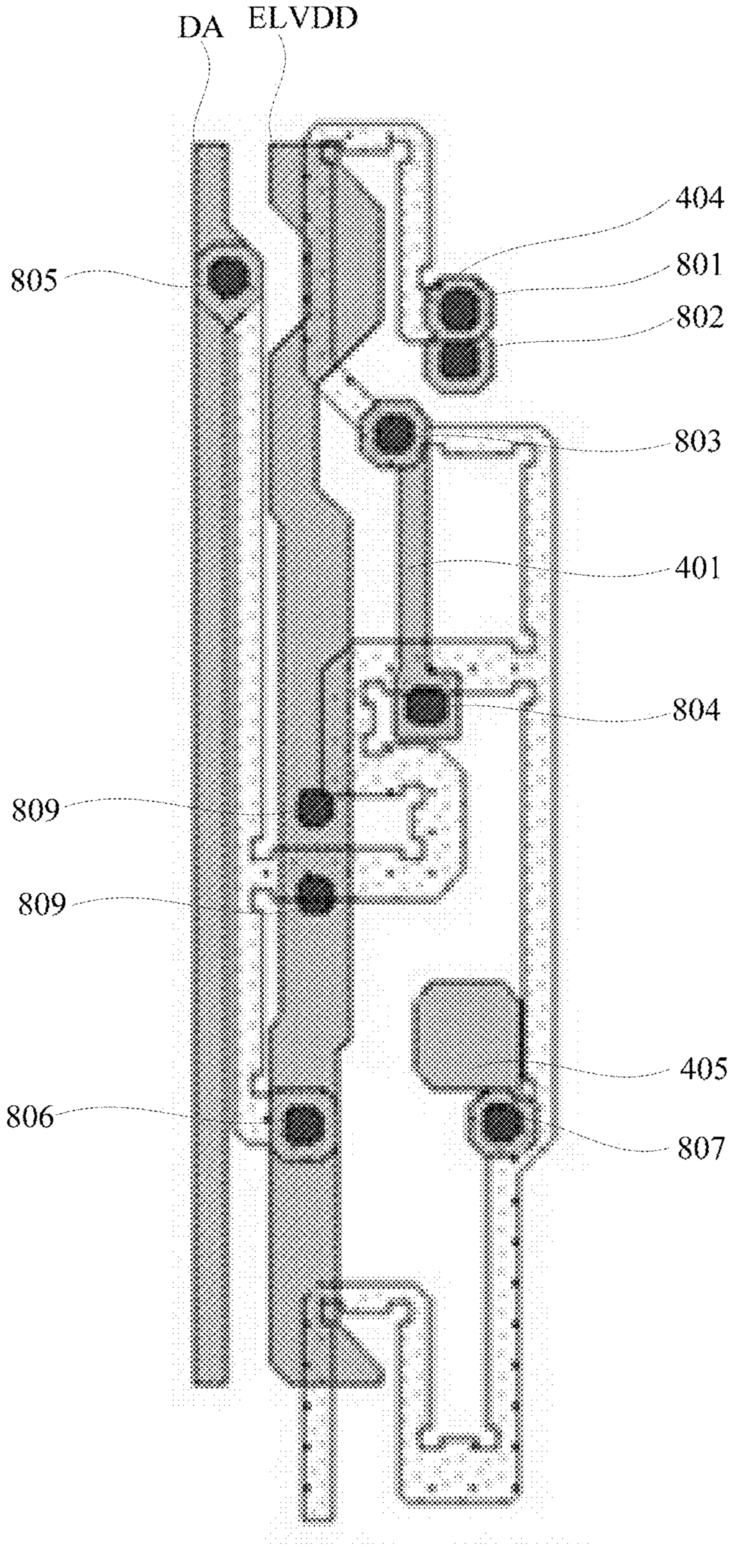
FIG. 6 is a schematic diagram of the layout of the active layer and the first source-drain metal layer in FIG. 2.
Figure 7:
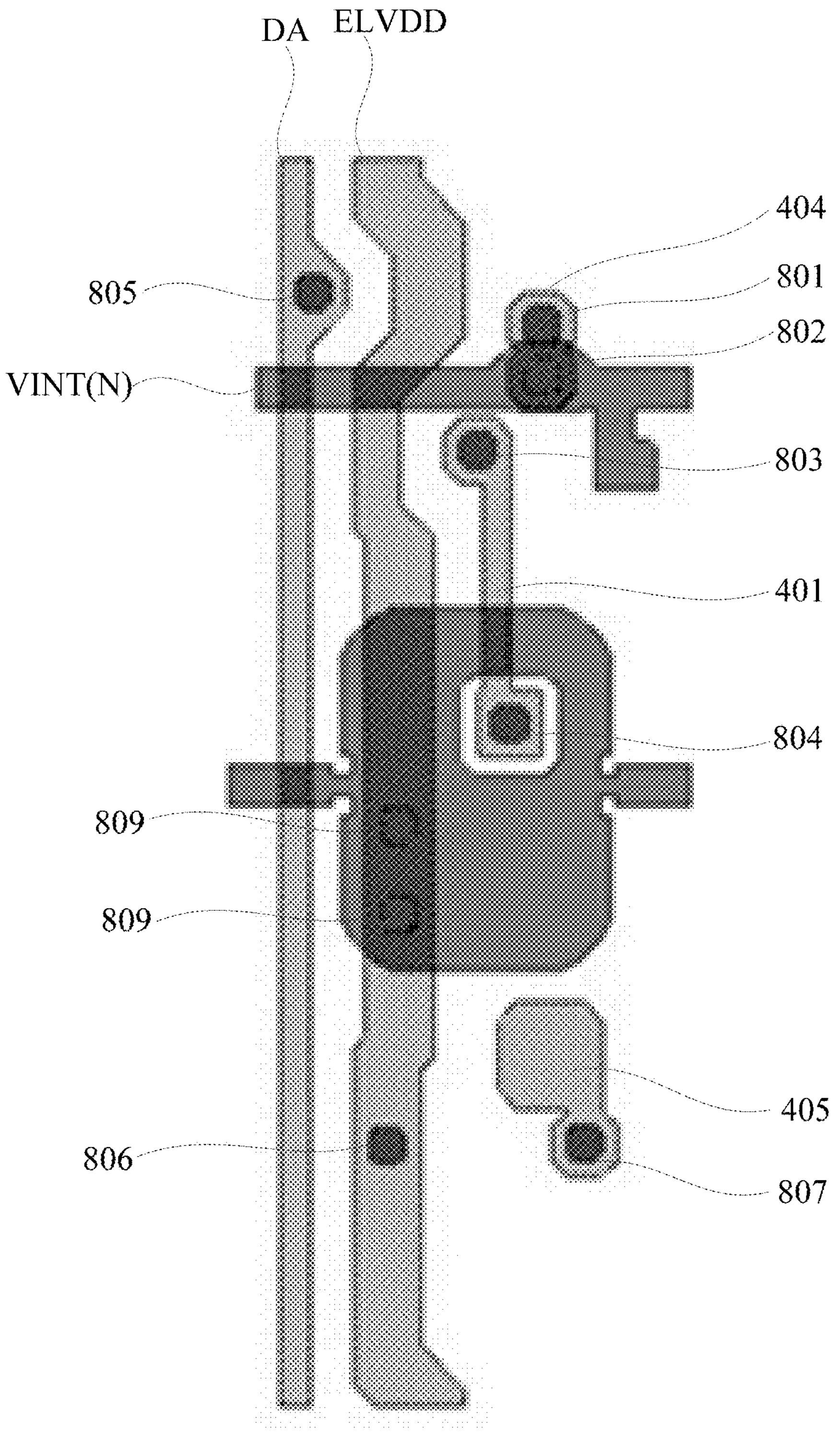
FIG. 7 is a schematic diagram of the layout of the second gate metal layer and the first source-drain metal layer in FIG. 2.
Figure 8:
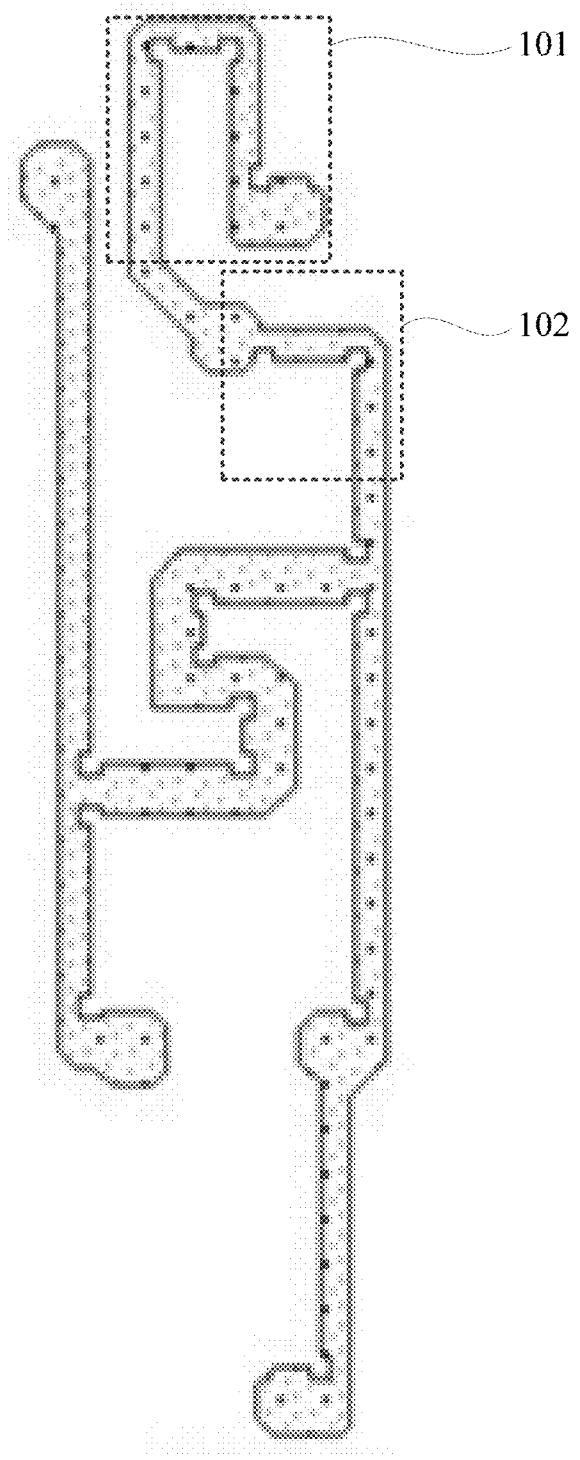
FIG. 8 is a schematic diagram of the layout of the active layer in FIG. 2.

In FIG. 1, FIG. 3 and FIG. 5, the present disclosure provides a display substrate, the display substrate includes a base substrate and a plurality of sub-pixels arranged on the base substrate, each sub-pixel includes a first transistor T1, a second transistor T2, a third transistor T3, a fourth transistor T4, a fifth transistor T5, a sixth transistor T6, a seventh transistor T7 and a storage capacitor Cst.

Each sub-pixel further includes an initialization signal line VINT(N), a reset signal line RST(N), a gate line GA, a light-emitting control signal line EM, a power supply line ELVDD, a data line DA, a first connection portion, a second connection portion and a third connection portion. Each of the initialization signal line VINT(N), the reset signal line RST(N), the gate line GA and the light-emitting control signal line EM has a portion extending along a first direction. Each of the power supply line ELVDD and the data line DA has a portion extending along a second direction, and the second direction intersects the first direction.

In the same sub-pixel, an orthographic projection of the initialization signal line VINT(N) on the base substrate, an orthographic projection of the reset signal line RST(N) on the base substrate, and an orthographic projection of the gate line GA on the base substrate, an orthographic projections of the light-emitting control signal line EM on the base substrate are sequentially arranged along the second direction.

A gate electrode of the first transistor T1 is coupled to the reset signal line RST(N), and a first electrode of the first transistor T1 is coupled to the initialization signal line VINT(N) through the third connection portion 403, a second electrode of the first transistor T1 is coupled to a gate electrode of the third transistor T3.

A gate electrode of the second transistor T2 is coupled to the gate line GA, a first electrode of the second transistor T2 is coupled to a second electrode of the third transistor T3, and the second electrode of the second transistor T2 is coupled to the gate electrode of the third transistor T3 through the first connection portion 401.

A gate electrode of the fourth transistor T4 is coupled to the gate line GA, a first electrode of the fourth transistor T4 is coupled to the data line DA, and a second electrode of the fourth transistor T4 is coupled to the first electrode of the third transistor T3.

A gate electrode of the fifth transistor T5 is coupled to the light-emitting control signal line EM, a first electrode of the fifth transistor T5 is coupled to the power line ELVDD, and a second electrode of the fifth transistor T5 is coupled to the first electrode of the third transistor T3.

A gate electrode of the sixth transistor T6 is coupled to the light-emitting control signal line EM, a first electrode of the sixth transistor T6 is coupled to the second electrode of the third transistor T3, and the second electrode of the sixth transistor T6 is coupled to the light-emitting element in the sub-pixel.

A gate electrode of the seventh transistor T7 is coupled to the reset signal line RST(N+1) in the next sub-pixel adjacent along the second direction, and a first electrode of the seventh transistor T7 is coupled to the initialization signal line VINT(N+1) in the next sub-pixel adjacent along the second direction through the second connection portion 402, and a second electrode of the seventh transistor T7 is coupled to the light-emitting element in the sub-pixel.

The gate electrode of the third transistor T3 is multiplexed as a first electrode plate of the storage capacitor, and a second electrode plate of the storage capacitor is coupled to the power line ELVDD.

It should be noted that the second connection portion is multiplexed as the third connection portion in the next sub-pixel adjacent along the second direction.

In the above-mentioned display substrate, since the distance between the first electrode of the first transistor T1 and the initialization signal line VINT(N) is relatively long, it is necessary to set the length of the third connection portion 403 extending along the second direction to be relatively large, so that the size of the third connection portion 403 is large, which not only affects the transmittance of the display substrate to a certain extent, is not conducive to the working stability of the display substrate, but also increases the layout difficulty of the display substrate.

Figure 4:
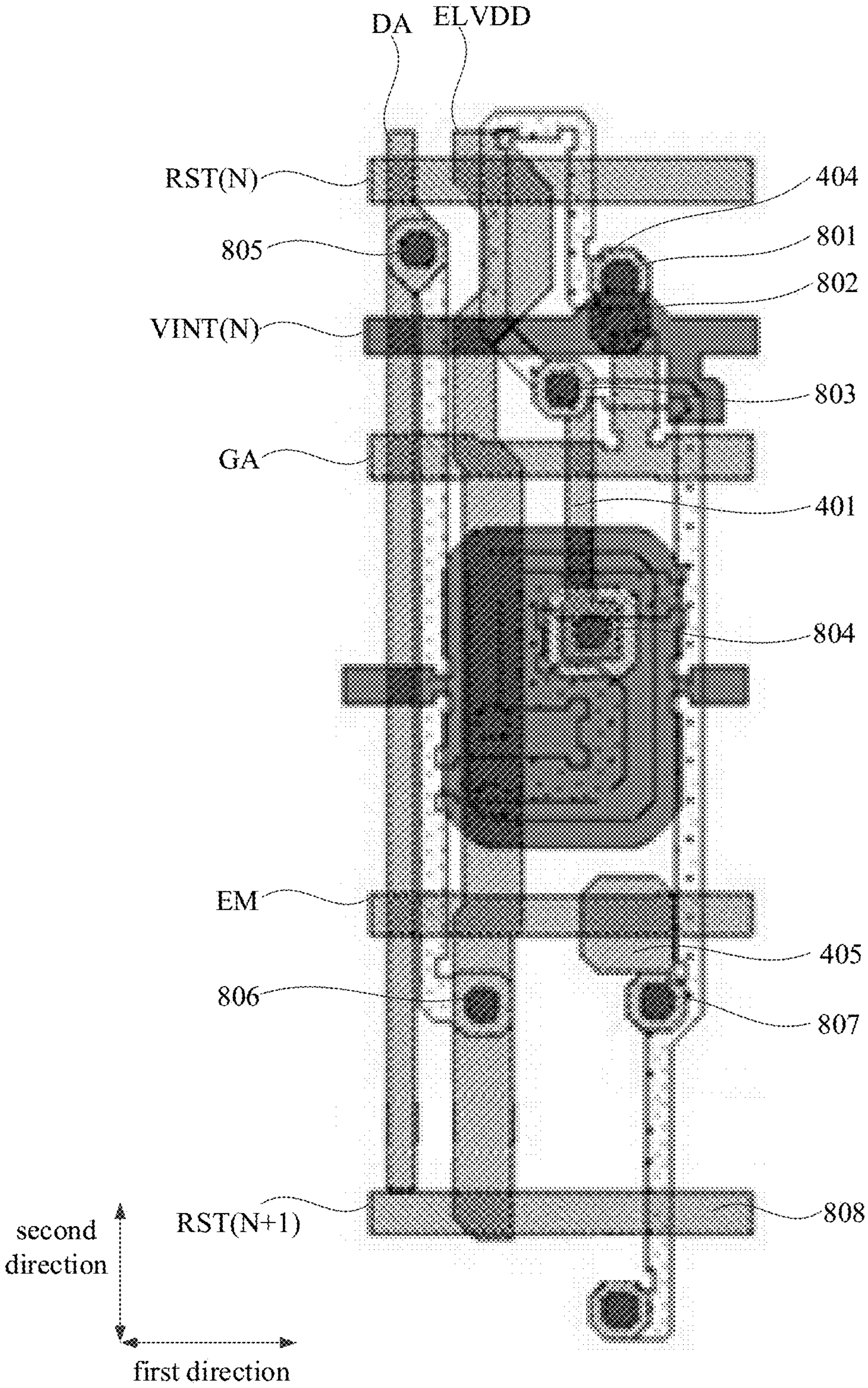
FIG. 4 is a second layout flowchart of the sub-pixel driving circuit in FIG. 1.

Referring to FIG. 4 and FIG. 5, an embodiment of the present disclosure provides a display substrate, including: a base substrate and a plurality of sub-pixels arranged on the base substrate; the sub-pixels include:

a reset signal line RST(N), at least a part of the reset signal line RST(N) extending along a first direction;

an initialization signal line VINT(N), at least a part of the initialization signal line VINT(N) extending along the first direction;

a first transistor T1, a gate electrode of the first transistor T1 being coupled to the reset signal line RST(N), a first electrode of the first transistor T1 being coupled to the initialization signal line VINT(N), a second electrode of the first transistor T1 being coupled to a gate electrode of the driving transistor (i.e., the third transistor T3); an orthographic projection of at least part of the first electrode of the first transistor T1 on the base substrate being located between an orthographic projection of the reset signal line RST(N) on the base substrate and an orthographic projection of the initialization signal line VINT(N) on the base substrate;

Exemplarily, the first direction includes a horizontal inversion, and the second direction includes a vertical direction.

Exemplarily, the display substrate includes an active layer, a first gate insulating layer, a first gate metal layer, a second gate insulating layer, a second gate metal layer, and an interlayer insulating layer, a first source-drain metal layer and a planarization layer that are sequentially stacked along a direction away from the substrate.

Exemplarily, the first gate metal layer includes the reset signal line RST(N) and the gate line GA, and the second gate metal layer includes the initialization signal line VINT(N).

Exemplarily, the sub-pixel includes a pixel driving circuit and a light-emitting element, and the pixel driving circuit is coupled to an anode of the light-emitting element for driving the light-emitting element to emit light. The plurality of pixel driving circuits included in the plurality of sub-pixels are arranged on the base substrate in an array.

Exemplarily, the plurality of pixel driving circuits can be divided into a plurality of rows of pixel driving circuits and a plurality of columns of pixel driving circuits. The plurality of rows of pixel driving circuits are arranged along the second direction, and each row of pixel driving circuits includes a plurality of pixel driving circuits arranged along the first direction. The plurality of columns of pixel driving circuits are arranged along the first direction, and each column of pixel driving circuits includes a plurality of pixel driving circuits arranged along the second direction.

Exemplarily, the pixel driving circuit includes a driving transistor, a first transistor T1 and a seventh transistor T7, the first transistor T1 is used for resetting the gate electrode of the driving transistor, and the first electrode of the first transistor T1 is coupled to the initialization signal line VINT(N), the seventh transistor T7 is used for resetting the anode of the light-emitting element, and the first electrode of the seventh transistor T7 is coupled to the initialization signal line VINT(N+1) in the next sub-pixel adjacent along the second direction.

Exemplarily, in the same row of pixel driving circuits, the reset signal lines RST(N) correspondingly coupled to the pixel driving circuits are sequentially coupled to form an integrated structure, and the initialization signal lines VINT (N) correspondingly coupled to the pixel driving circuits are sequentially coupled to form an integrated structure, and the gate lines GA correspondingly coupled to the pixel driving circuits are sequentially coupled to form an integrated structure.

Exemplarily, when each sub-pixel further includes a light-emitting control signal line EM, a power supply line ELVDD and a data line DA, in the same row of pixel driving circuits, the light-emitting control signal lines EM correspondingly coupled to the pixel driving circuits are sequentially coupled to form an integrated structure. In the same column of pixel driving circuits, the power lines ELVDD correspondingly coupled the pixel driving circuits are sequentially coupled to form an integrated structure. In the same column of pixel driving circuits, the data lines DA correspondingly coupled to the pixel driving circuits are sequentially coupled to form an integrated structure.

According to the specific structure of the above-mentioned display substrate, in the display substrate provided by the embodiments of the present disclosure, the orthographic projection of at least a part of the first electrode of the first transistor T1 on the base substrate is located between the orthographic projection of the reset signal line RST on the based substrate and the orthographic projection of the initialization signal line VINT(N) on the base substrate, so that the distance between the initialization signal line VINT(N) and the first electrode of the first transistor T1 in the sub-pixel to which the initialization signal line VINT(N) belongs and the distance between the initialization signal line VINT(N) and the first electrode of the seventh transistor T7 in the previous sub-pixel adjacent along the second direction are both relatively small, so that when the initialization signal line VINT(N) is connected to the first electrode of the first transistor T1 in the sub-pixel to which the initialization signal line VINT(N) belongs through the conductive connection portion 404, and the initialization signal line VINT(N) is connected to the first electrode of the seventh transistor T7 in the previous sub-pixel adjacent along the second direction through the conductive connection portion 404, the size of the conductive connection portion 404 can be effectively reduced. Therefore, in the display substrate provided by the embodiment of the present disclosure, the shielding area of the conductive connection portion 404 is reduced, so that the display substrate has good transmittance, and the display substrate is applied to a under-screen sensor product with transmittance requirements, it can ensure that the sensor product has good functionality. Moreover, in the display substrate provided by the embodiment of the present disclosure, by reducing the size of the conductive connection portion 404, it is more beneficial to avoid crosstalk between the conductive connection portion 404 and other structures around it, thereby effectively improving the stability of the display substrate. In addition, by reducing the size of the conductive connection portion 404, the layout space occupied by the conductive connection portion 404 is reduced, thereby reducing the overall layout difficulty of the display substrate.

As shown in FIG. 4 to FIG. 7, in some embodiments, the sub-pixel further includes a conductive connection portion 404, and the conductive connection portion 404 is respectively connected to the first electrode of the first transistor T1 and the initialization signal line VINT(N), the orthographic projection of the conductive connection portion on the base substrate is located between the orthographic projection of the reset signal line on the base substrate and the orthographic projection of the initialization signal line on the base substrate; along the second direction, the length of the conductive connection portion 404 is smaller than the distance between the orthographic projection of the reset signal line RST(N) on the base substrate and the orthographic projection of the initialization signal line VINT(N) on the base substrate.

Exemplarily, the conductive connection portion 404 is arranged at the same layer and made of the same material as the power line ELVDD and the data line DA.

Exemplarily, the conductive connection portion 404 extends along the second direction.

Exemplarily, the length of the conductive connection portion 404 in the second direction is less than or equal to the maximum width of the initialization signal line VINT(N) in the second direction.

As shown in FIGS. 4 to 7, exemplarily, there is a first overlapping area between the orthographic projection of the first end of the conductive connection portion 404 on the base substrate and the orthographic projection of the first electrode of the first transistor T1 on the base substrate, the first end of the conductive connection portion 404 is coupled to the first electrode of the first transistor T1 through the first via hole 801; there is a second overlapping area between the orthographic projection of the second end of the conductive connection portion 404 on the base substrate and the orthographic projection of the main body 61 on the base substrate and the orthographic projection of the protrusion portion 60 on the base substrate respectively. The second end of the conductive connection portion 404 is coupled to the main body 61 and the protrusion portion 60 through a second via hole 802.

Exemplarily, the first via hole penetrates the interlayer insulating layer, the second gate insulating layer and the first gate insulating layer; the second via hole penetrates the interlayer insulating layer and the second gate insulating layer.

In the display substrate provided by the above embodiment, the length of the conductive connection portion 404 along the second direction is less than the distance between the orthographic projection of the reset signal line RST(N) on the base substrate and the orthographic projections of the initialization signal line VINT(N) on the base substrate, which effectively reduces the size of the conductive connection portion 404. Therefore, in the display substrate provided by the above-mentioned embodiment, the shielding area of the conductive connection portion 404 is reduced, so that the display substrate has good transmittance, and the display substrate is applied to the under-screen sensor product with a requirement for transmittance, it can ensure that the sensor products have good functionality. Moreover, in the display substrate provided by the embodiment of the present disclosure, by reducing the size of the conductive connection portion 404, it is more beneficial to avoid crosstalk between the conductive connection portion 404 and other structures around it, thereby effectively improving the stability of the display substrate. In addition, by reducing the size of the conductive connection portion 404, the layout space occupied by the conductive connection portion 404 is reduced, thereby reducing the overall layout difficulty of the display substrate.

As shown in FIGS. 4 to 7, in some embodiments, the orthographic projection of the conductive connection portion 404 on the base substrate does not overlap the orthographic projection of the reset signal line RST(N) on the base substrate.

The above arrangement avoids the generation of overlapping capacitance between the conductive connection portion 404 and the reset signal line RST(N), which is beneficial to avoid generation of the crosstalk between the conductive connection portion 404 and the reset signal line RST(N) and effectively improves the stability of the display substrate.

As shown in FIG. 4 to FIG. 8 and FIG. 11, in some embodiments, the sub-pixel further includes: a driving transistor, the first transistor T1 and the second transistor T2;

The gate electrode of the second transistor T2 is coupled to the gate line GA, the first electrode of the second transistor T2 is coupled to the second electrode of the driving transistor, and the second electrode of the second transistor T2 coupled to the gate electrode of the driving transistor.

Exemplarily, the reset signal line RST(N) is multiplexed as the gate electrode of the first transistor T1.

Exemplarily, the first transistor T1 is of a double gate structure, the first transistor T1 includes a first active pattern 101, at least a part of the first active pattern 101 is of an n-shaped structure, the orthographic projection of the first active pattern 101 on the base substrate and the orthographic projection of the reset signal line RST(N) on the base substrate can form two independent overlapping regions.

Exemplarily, the first end of the first active pattern 101 serves as the first electrode of the first transistor T1, and the second end of the second active pattern 102 serves as the second electrode of the first transistor T1.

Exemplarily, the second transistor T2 has a double-gate structure, and the second transistor T2 includes a second active pattern 102, and the second active pattern 102 is of a "¬"-shaped structure.

Exemplarily, the second transistor T2 is a compensation transistor for compensating the threshold voltage of the driving transistor.

In the display substrate provided by the above embodiment, the orthographic projection of the first electrode of the first transistor T1 on the base substrate is located between the orthographic projection of the reset signal line RST(N) on the base substrate and the orthographic projection of the gate line GA on the base substrate, the distance between the first electrode of the first transistor T1 and the initialization signal line VINT(N) is relatively small, so that when the initialization signal line VINT(N) is connected to the first electrode of the first transistor T1 in the sub-pixel to which it belongs through the conductive connection portion 404, the size of the conductive connection portion 404 can be effectively reduced, and the shielding area of the conductive connection portion 404 can be reduced. Therefore, the display substrate provided by the above embodiments has good transmittance, and when the display substrate is applied to an under-screen sensor product with transmittance requirements, the sensor product can be guaranteed to have good functionality.

As shown in FIG. 4 and FIG. 5, in some embodiments, the orthographic projection of the first electrode of the first transistor T1 on the base substrate partially overlaps the orthographic projection of the initialization signal line VINT (N) on the base substrate.

The above setting method further reduces the distance between the first electrode of the first transistor T1 and the initialization signal line VINT(N), and when the initialization signal line VINT(N) is connected to the first electrode of the first transistor T1 in the sub-pixel to which the initialization signal line VINT(N) belongs through the conductive connection portion 404, the size of the conductive connection portion 404 can be further reduced, and the shielding area of the conductive connection portion 404 can be reduced.

Figure 10:
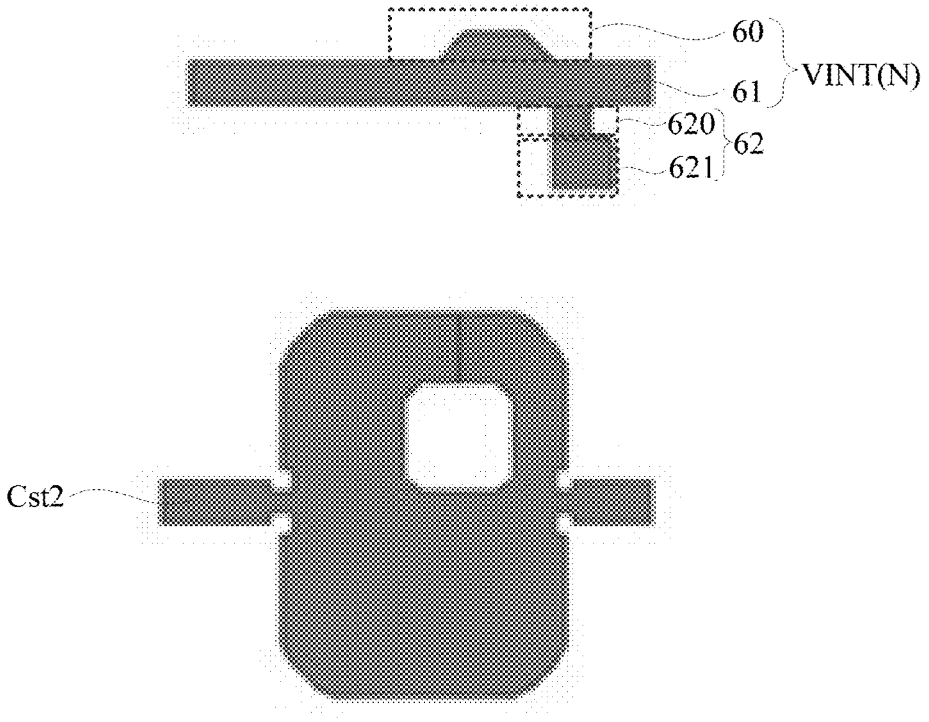
FIG. 10 is a schematic diagram of the layout of the second gate metal layer in FIG. 2.
Figure 11:
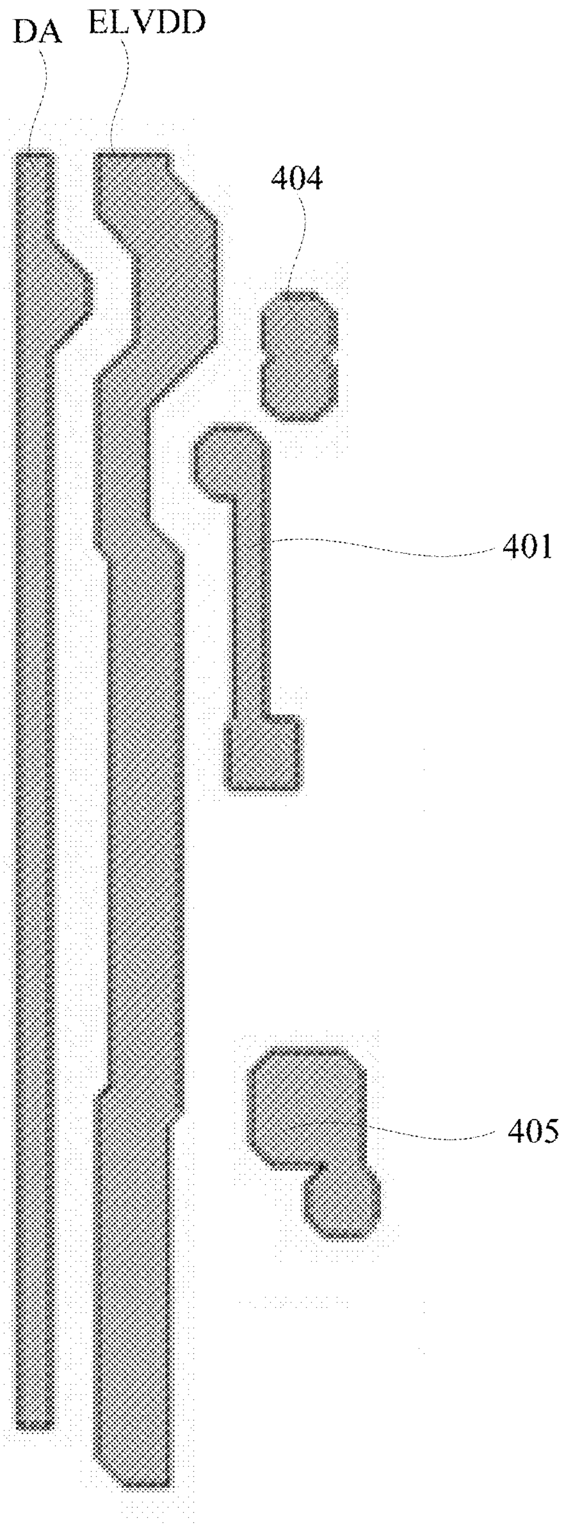
FIG. 11 is a schematic diagram of the layout of the first source-drain metal layer in FIG. 2.

As shown in FIG. 4, FIG. 5 and FIG. 10, in some embodiments, the initialization signal line VINT(N) includes a main body 61 and a protrusion portion 60, and the main body 61 extends along the first direction, the orthographic projection of the protrusion portion 60 on the base substrate at least partially overlaps the orthographic projection of the first electrode of the first transistor T1 on the base substrate.

Exemplarily, the main body 61 and the protrusion portion 60 are formed as an integrated structure.

Exemplarily, the orthographic projection of the protrusion portion 60 on the base substrate is located between the orthographic projection of the main body 61 on the base substrate and the orthographic projection of the reset signal line RST(N) on the base substrate.

Exemplarily, the orthographic projection of the main body 61 on the base substrate at least partially overlaps the orthographic projection of the first electrode of the first transistor T1 on the base substrate.

In the display substrate provided by the above embodiment, the orthographic projection of the protrusion portion 60 on the base substrate at least partially overlaps the orthographic projection of the first electrode of the first transistor T1 on the base substrate, the distance between the first electrode of the first transistor T1 and the initialization signal line VINT(N) is reduced, and when the initialization signal line VINT(N) is connected to the first electrode of the first transistor T1 in the sub-pixel to which the initialization signal line VINT(N) belongs through the conductive connection portion 404, the size of the conductive connection portion 404 can be effectively reduced, and the shielding area of the conductive connection portion 404 can be reduced.

Moreover, the above arrangement also avoids a large overlapping area between the first electrode of the first transistor T1 and the initialization signal line VINT(N), and avoids to generate a large parasitic capacitance between the first electrode of the first transistor T1 and the initialization signal line VINT(N), which affects the working stability of the display substrate.

Figure 9:
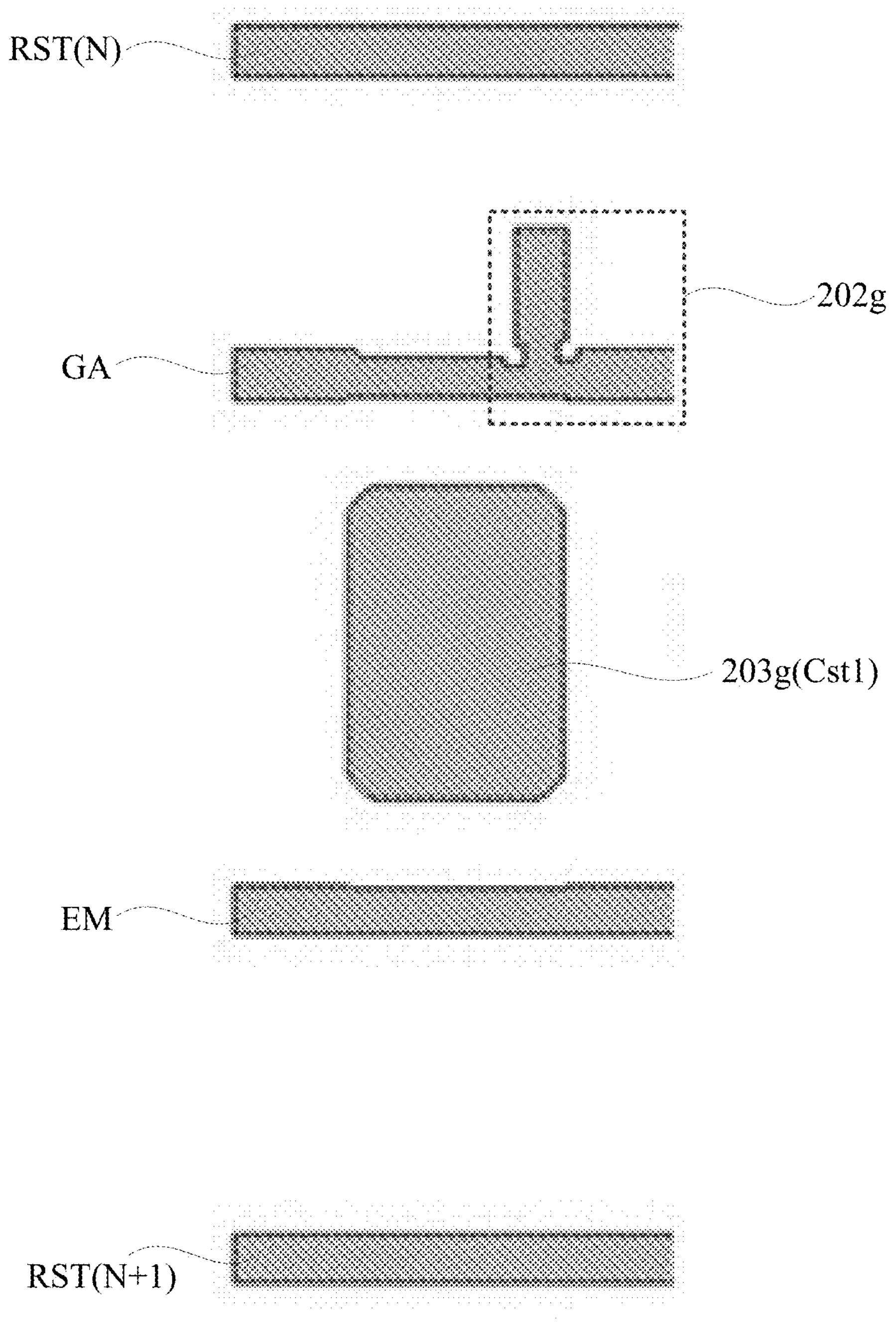
FIG. 9 is a schematic diagram of the layout of the first gate metal layer in FIG. 2.

As shown in FIG. 4, FIG. 5 and FIG. 9, in some embodiments, the sub-pixel further includes: a gate line GA, at least a part of the gate line GA extends along the first direction; the orthographic projection of the initialization signal line VINT(N) on the base substrate is located between the orthographic projection of the reset signal line RST(N) on the base substrate and the orthographic projection of the gate line GA on the base substrate.

In the display substrate provided by the above embodiment, the orthographic projection of the first electrode of the first transistor T1 on the base substrate is located between the orthographic projection of the reset signal line RST(N) on the base substrate and the orthographic projection of the gate line GA on the base substrate; and the orthographic projection of the initialization signal line VINT(N) on the base substrate is located between the orthographic projection of the reset signal line RST(N) on the base substrate and the orthographic projection of the gate line GA on the base substrate; the distance between the first electrode of the first transistor T1 and the initialization signal line VINT(N) is relatively small, so that when the initialization signal line VINT(N) is connected to the first electrode of the first transistor T1 in the sub-pixel to which it belongs through the conductive connection portion 404, the size of the conductive connection portion 404 can be effectively reduced.

As shown in FIG. 4, FIG. 5, FIG. 9 and FIG. 10, in some embodiments, the orthographic projection of the initialization signal line VINT(N) on the base substrate at least partially overlaps the orthographic projection of the gate electrode 202*g* of the second transistor T2 on the base substrate.

Exemplarily, the orthographic projection of the main body 61 on the base substrate at least partially overlaps the orthographic projection of the gate electrode 202*g* of the second transistor T2 on the base substrate.

The above arrangement makes the main body 61 closer to the second electrode of the second transistor T2, which is beneficial to the stability of the second electrode of the second transistor T2, the second electrode of the second transistor T2 is coupled to the gate electrode of the driving transistor, so that the potential of the gate electrode of the driving transistor is not easily affected by external crosstalk.

As shown in FIGS. 4, 5, 7, 8 and 10, in some embodiments, the second transistor T2 includes a second active pattern 102, and the second active pattern 102 includes a conductor portion 1021 and two semiconductor portions 1022, the conductor portion 1021 is respectively coupled to the two semiconductor portions 1022;

The sub-pixel further includes a shielding pattern 62, the shielding pattern 62 is coupled to the initialization signal line VINT(N), and the orthographic projection of the shielding pattern 62 on the base substrate at least partially overlaps the orthographic projection of the conductor portion 1021 on the base substrates.

Exemplarily, the second active pattern 102 includes a conductor portion 1021 and two semiconductor portions 1022, and the conductor portion 1021 has better electrical conductivity than the two semiconductor portions 1022, the orthographic projection of the two semiconductor portion 1022 on the base substrate is located inside the orthographic projection of the gate electrode of the second transistor T2 on the base substrate.

Exemplarily, an initialization signal with a fixed potential is transmitted on the initialization signal line VINT(N), and the shielding pattern 62 is coupled to the initialization signal line VINT(N), so that the shield pattern 62 has a fixed potential.

In the display substrate provided by the above embodiment, the orthographic projection of the shielding pattern 62 on the base substrate at least partially overlaps the orthographic projection of the conductor portion 1021 on the base substrate, so that the shielding pattern 62 has a good shielding effect on the conductor portion 1021, and the influence of the change of the data signal on the data line DA in the adjacent sub-pixels along the first direction on the conductor portion 1021 is avoided, thus the working stability of the second transistor T2 and the driving transistor coupled to the second transistor T2.

In addition, the shielding pattern 62 is coupled to the initialization signal line VINT(N), the size of the shielding pattern 62 is effectively reduced, the shielding area of the shielding pattern 62 is reduced, and the display substrate has good transmittance. When the display substrate is applied to an under-screen sensor product that requires transmittance, it can ensure that the sensor product has good functionality. Moreover, in the display substrate provided by the above embodiment, by reducing the size of the shielding pattern 62, it is more beneficial to avoid parasitic capacitance between the shielding pattern 62 and other surrounding structures, and effectively improve the stability of the display substrate. In addition, by reducing the size of the shielding pattern 62, the layout space occupied by the shielding pattern 62 is reduced, thereby reducing the overall layout difficulty of the display substrate.

In some embodiments, the shielding pattern 62 and the initialization signal line VINT(N) are arranged to form an integrated structure.

The above arrangement enables the shielding pattern 62 and the initialization signal line VINT(N) to be formed in the same patterning process, which simplifies the manufacturing process of the display substrate and saves the manufacturing cost of the display substrate.

As shown in FIG. 4, FIG. 5, FIG. 7, FIG. 8 and FIG. 10, in some embodiments, the shielding pattern 62 includes a first sub-pattern 620 and a second sub-pattern 621, and the first sub-pattern 620 extends along the second direction, the second direction intersects the first direction, the second sub-pattern 621 extends along the first direction, and the orthographic projection of the second sub-pattern 621 on the base substrate at least partially overlaps the orthographic projection of the conductor portion 1021 on the base substrate.

Exemplarily, the first sub-pattern 620 and the second sub-pattern 621 form an integrated structure.

Exemplarily, the shielding pattern 62 is formed in an L-shaped structure.

Exemplarily, the width of the first sub-pattern 620 in the direction perpendicular to the extending direction of the first sub-pattern 620 is smaller than the width of the second sub-pattern 621 in the direction perpendicular to the extending direction of the second sub-pattern 621.

In the display substrate provided by the above embodiment, the shielding pattern 62 includes the first sub-pattern 620 and the second sub-pattern 621, the shielding pattern 62 can have a good shielding effect and occupy a smaller layout space, which is beneficial to improve the resolution of the display substrate.

Figure 12:
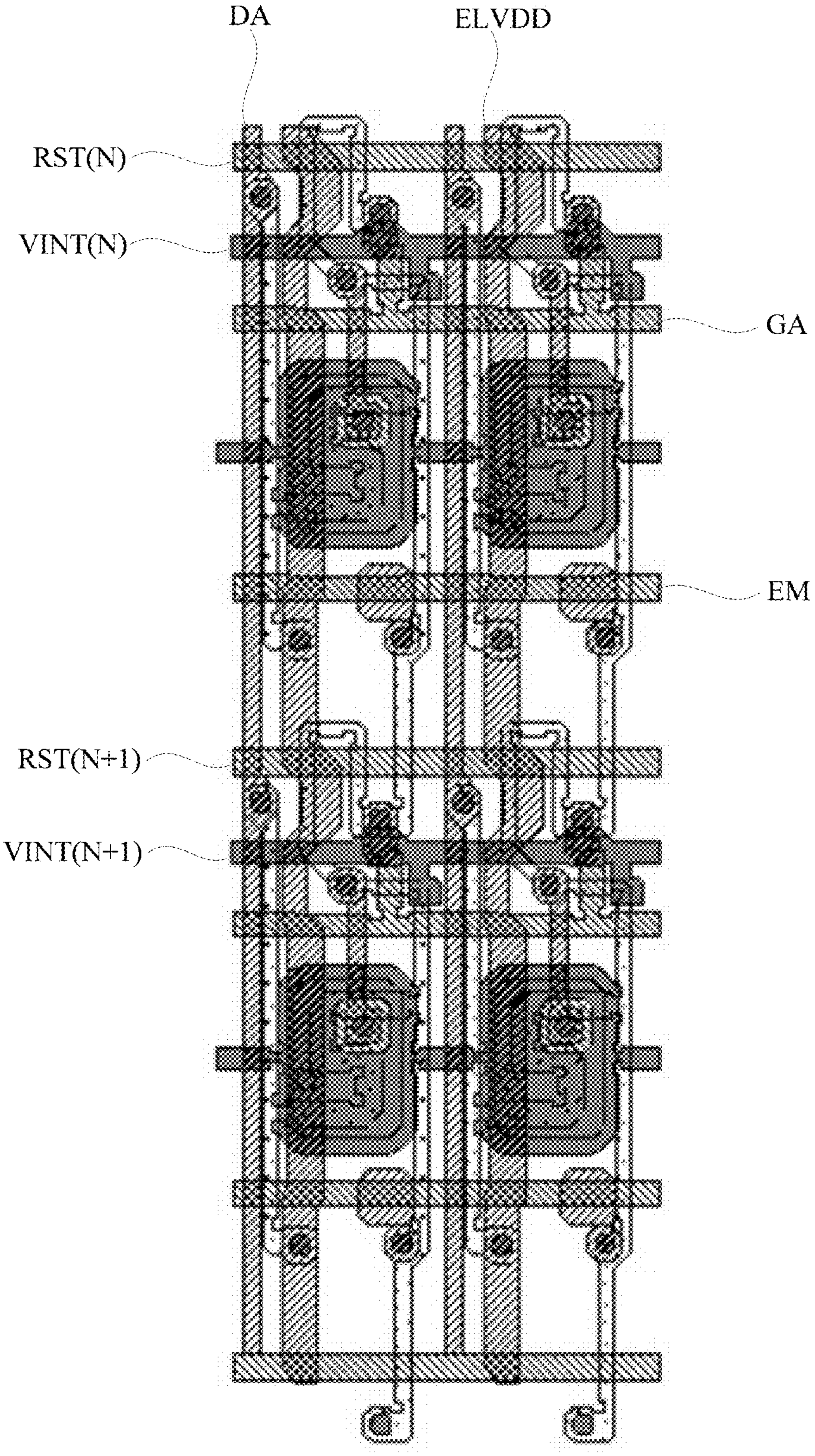
FIG. 12 is a schematic diagram of the layout of four sub-pixel driving circuits arranged in an array.

As shown in FIG. 5 and FIG. 12, in some embodiments, the sub-pixel further includes a light-emitting element and a seventh transistor T7, and the gate electrode of the seventh transistor T7 is coupled to the reset signal line RST(N+1) in the next sub-pixel adjacent along the second direction. The first electrode of the seventh transistor T7 is coupled to the initialization signal line VINT(N+1) in the next sub-pixel adjacent along the second direction, the second electrode of the seventh transistor T7 is coupled to the light-emitting element, and the second direction intersects the first direction;

The orthographic projection of the first electrode of the seventh transistor T7 on the base substrate is located between the orthographic projection of the reset signal line RST(N+1) in the next sub-pixel adjacent to the second direction on the base substrate and the orthographic projections of the initialization signal line VINT(N+1) in the next sub-pixel adjacent along the second direction on the base substrate.

Exemplarily, the seventh transistor T7 is turned on under the control of the reset signal line RST(N+1) in the next sub-pixel adjacent along the second direction, and the anode of the light-emitting element is coupled to the initialization signal lines VINT(N+1) in the next sub-pixel adjacent along the second direction to reset the anode of the light-emitting element.

Exemplarily, in the next sub-pixel adjacent along the second direction, the orthographic projection of the initialization signal line VINT(N+1) on the base substrate is located between the orthographic projection of the reset signal line RST(N+1) on the base substrate and the orthographic projection of the gate line GA on the base substrate.

In the display substrate provided by the above embodiment, the orthographic projection of the first electrode of the seventh transistor T7 on the base substrate is located between the orthographic projection of the reset signal line RST (N+1) in the next sub-pixel adjacent along the second direction on the base substrate and the orthographic projection of the initialization signal line VINT(N+1) in the next sub-pixel adjacent along the second direction on the base substrate, so that the distance between the first electrode of the seven transistor T7 and the initialization signal line VINT(N+1) in the next sub-pixel adjacent along the second direction is relatively small, so that when the first electrode of the seventh transistor T7 is connected to the initialization signal line VINT(N+1) in the next sub-pixel adjacent along the second direction through the conductive connection portion 404, the size of the conductive connection portion 404 can be effectively reduced, and the shielding area of the conductive connection portion 404 can be reduced.

As shown in FIG. 5 and FIG. 12, in some embodiments, the first electrode of the seventh transistor T7 and the first electrode of the first transistor T1 in the next sub-pixel adjacent to the second direction are formed as an integrated structure.

The above arrangement enables the first electrode of the seventh transistor T7 and the first electrode of the first transistor T1 in the next sub-pixel adjacent to the second direction to be connected to the initialization signal line VINT(N) through the same conductive connection portion 404, thereby further improving the transmittance of the array substrate.

As shown in FIG. 1, FIG. 4 and FIG. 12, in some embodiments, the sub-pixel further include:

a light-emitting control signal line EM, at least part of the light-emitting control signal line EM extending along the first direction;

a power supply line ELVDD, at least part of the power supply line ELVDD extending along the second direction;

a data line DA, at least part of the data line DA extending along the second direction;

A fourth transistor T4, wherein the gate electrode of the fourth transistor T4 is coupled to the gate line GA, the first electrode of the fourth transistor T4 is coupled to the data line DA, the second electrode of the fourth transistor T4 is coupled to the first electrode of the driving transistor;

A fifth transistor T5, wherein the gate electrode of the fifth transistor T5 is coupled to the light-emitting control signal line EM, the first electrode of the fifth transistor T5 is coupled to the power line ELVDD, the second electrode of the fifth transistor T5 is coupled to the first electrode of the driving transistor;

A sixth transistor T6, wherein the gate electrode of the sixth transistor T6 is coupled to the light-emitting control signal line EM, the first electrode of the sixth transistor T6 is coupled to the second electrode of the driving transistor, and the second electrode of the sixth transistor T6 is coupled to the light-emitting element;

A storage capacitor, wherein the gate electrode of the driving transistor is multiplexed as the first electrode plate of the storage capacitor, and the second electrode plate of the storage capacitor is coupled to the power line ELVDD.

As shown in FIG. 1, FIG. 4 and FIG. 12, the sub-pixels include sub-pixel driving circuits arranged in an array. Taking one sub-pixel driving circuit as an example, the sub-pixel driving circuit includes 7 thin film transistors and 1 capacitor. The transistors included in the sub-pixel driving circuit are all P-type transistors, the first electrode of each transistor includes a source electrode, and the second electrode of each transistor includes a drain electrode.

The first transistor T1 (i.e., the reset transistor) has a double-gate structure, the gate electrode 201*g* of the first transistor T1 is coupled to the reset signal line RST(N), and the source electrode S1 of the first transistor T1 is coupled to the initialization signal line VINT(N) through the first via hole 801, the conductive connection portion 404 and the second via hole 802, and the drain electrode D1 of the first transistor T1 is coupled to the drain electrode D2 of the second transistor T2. The first via hole 801 penetrates the first gate insulating layer, the second gate insulating layer and the interlayer insulating layer; the second via hole 802 penetrates the interlayer insulating layer.

The second transistor T2 has a double gate structure, the gate electrode 202*g* of the second transistor T2 (i.e. the compensation transistor) is coupled to the gate line GA, the source electrode S2 of the second transistor T2 is coupled to the drain electrode D of the third transistor T3 (i.e. the driving transistor), and the drain electrode D2 of the second transistor T2 is coupled to the gate electrode 203*g* of the third transistor T3 through the third via hole 803, the first connection portion 401 and the fourth via hole 804. The third via hole 803 penetrates the first gate insulating layer, the second gate insulating layer and the interlayer insulating layer; the fourth via hole 804 penetrates the second gate insulating layer and the interlayer insulating layer.

The gate electrode 204*g* of the fourth transistor T4 (i.e., the data writing-in transistor) is coupled to the gate line GA, the source electrode S4 of the fourth transistor T4 is coupled to the data line DA through the fifth via hole 805, and the drain electrode D4 of the fourth transistor T4 is coupled to the source electrode S3 of the third transistor T3. The fifth via hole 805 penetrates the first gate insulating layer, the second gate insulating layer and the interlayer insulating layer.

The gate electrode 205*g* of the fifth transistor T5 is coupled to the light-emitting control signal line EM, the source electrode S5 of the fifth transistor T5 is coupled to the power line ELVDD through the sixth via hole 806, and the drain electrode D5 of the fifth transistor T5 is coupled to the source electrode S3 of the third transistor T3. The sixth via hole 806 penetrates the first gate insulating layer, the second gate insulating layer and the interlayer insulating layer.

The gate electrode 206*g* of the sixth transistor T6 is coupled to the light-emitting control signal line EM, the source electrode S6 of the sixth transistor T6 is coupled to the drain electrode D3 of the third transistor T3, and the drain electrode D6 of the sixth transistor T6 is coupled to the anode of the light emitting element EL through the seventh via hole 807, the fourth connection portion 405 and the via hole penetrating the planarization layer. The seventh via hole 807 penetrates the first gate insulating layer, the second gate insulating layer and the interlayer insulating layer.

The gate electrode 207*g* of the seventh transistor T7 is coupled to the reset signal line RST(N+1) in the next sub-pixel adjacent along the second direction, and the drain electrode D7 of the seventh transistor T7 is coupled to the drain electrode D7 of the sixth transistor T6. The source electrode S7 of the seventh transistor T7 is coupled to the initialization signal line VINT(N+1) in the next sub-pixel adjacent along the second direction through the eighth via hole 808.

The first electrode plate Cst1 of the storage capacitor Cst is multiplexed as the gate electrode 203*g* of the third transistor T3, and the second electrode plate Cst2 of the storage capacitor Cst is coupled to the power line ELVDD through at least one ninth via hole 809. The ninth via hole 809 penetrates the interlayer insulating layer.

Figure 2:
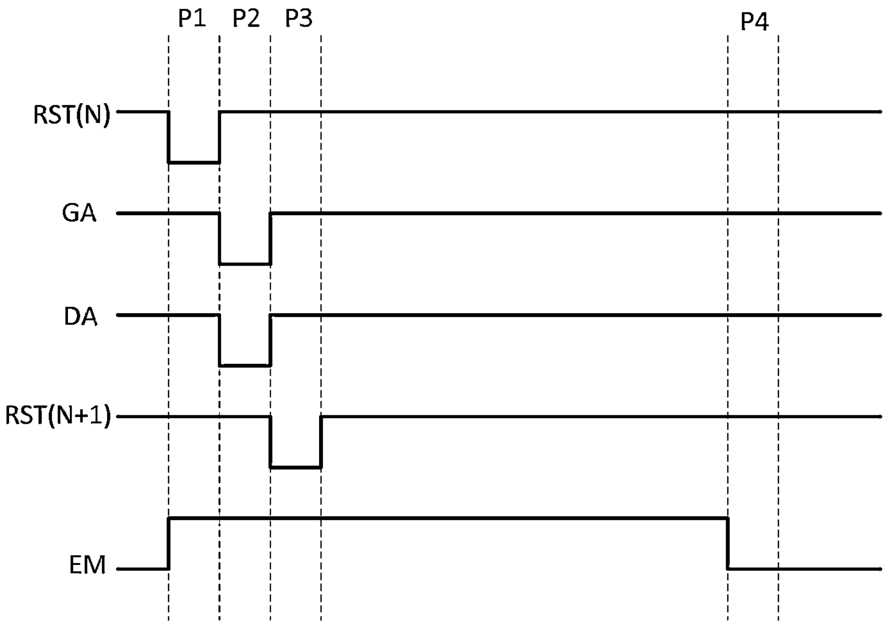
FIG. 2 is the working flow chart of the sub-pixel driving circuit in FIG. 1.

As shown in FIG. 2, when the sub-pixel driving circuit with the above structure is in operation, each working period includes a first reset phase P1, a writing-in compensation phase P2, a second reset phase P3 and a light-emitting phase P4.

In the first reset phase P1, the reset signal inputted by the reset signal line RST(N) is at an active level, the first transistor T1 is turned on, and the initialization signal transmitted by the initialization signal line VINT(N) is inputted to the gate electrode 203*g* of the third transistor T3, so that the gate-source voltage Vgs maintained on the third transistor T3 in the previous frame is cleared to reset the gate electrode 203*g* of the third transistor T3.

In the writing-in compensation phase P2, the reset signal is at an inactive level, the first transistor T1 is turned off, the gate scan signal inputted by the gate line GA is at an active level, and the second transistor T2 and the fourth transistor T4 are turned on, the data line DA writes a data signal and transmits the data signal to the source electrode S3 of the third transistor T3 through the fourth transistor T4, and at the same time, the second transistor T2 and the fourth transistor T4 are turned on, so that the third transistor T3 is formed into a diode structure, the second transistor T2, the third transistor T3 and the fourth transistor T4 work together to realize the threshold voltage compensation of the third transistor T3. When the compensation time is long enough, the potential of the gate electrode 203*g* of the third transistor T3 can reach Vdata+Vth, where Vdata represents the voltage value of the data signal, and Vth represents the threshold voltage of the third transistor T3.

In the second reset phase P3, the gate scan signal is at an inactive level, the second transistor T2 and the fourth transistor T4 are both turned off, the reset signal inputted by the reset signal line RST(N+1) is at an active level, and the seventh transistor T7 is turned on, the initialization signal transmitted by the initialization signal line pattern VINT(N+1) is inputted to the anode of the light-emitting element EL, and the light-emitting element EL is controlled not to emit light.

In the light-emitting phase P4, the light-emitting control signal written by the light-emitting control signal line pattern EM is at an active level, and the fifth transistor T5 and the sixth transistor T6 are turned on, so that the power signal transmitted by the power line is inputted to the source electrode S3 of the third transistor T3, at the same time, because the gate electrode 203*g* of the third transistor T3 is kept at Vdata+Vth, the third transistor T3 is turned on, and the gate-source voltage corresponding to the third transistor T3 is Vdata+Vth−VDD, where VDD is the voltage corresponding to the power signal, the drain current generated based on the gate-source voltage flows to the anode of the corresponding light-emitting element EL to drive the corresponding light-emitting element EL to emit light.

When forming the above sub-pixels, the layout of each film layer corresponding to the sub-pixels is as follows:

forming an active layer, a first gate insulating layer, a first gate metal layer, a second gate insulating layer, a second gate metal layer, an interlayer insulating layer, a first source-drain metal layer, a first planarization layer, a second source-drain metal layer, a second planarization layer, an anode layer, an organic light-emitting functional layer and a cathode layer that are subsequently arranged in a direction away from the base substrate. The cathode is connected to the negative power signal ELVSS.

As shown in FIG. 1, FIG. 4 and FIG. 5, in the display substrate provided by the present disclosure, in the second direction, the gate electrode 204*g* of the fourth transistor T4, the gate electrode 201*g* of the first transistor T1, and the gate electrode 202*g* of the second transistor T2 are located on the first side of the gate electrode of the driving transistor (i.e., the gate electrode 203*g* of the third transistor T3), the gate electrode of the seventh transistor T7, the gate electrode 206*g* of the sixth transistor T6, and the gate electrode of the fifth transistor T5 are all arranged on the second side of the gate electrode of the driving transistor. Exemplarily, the first side and the second side of the gate electrode of the driving transistor are opposite sides along the second direction, and further, the first side of the gate electrode of the driving transistor may be the upper side of the gate electrode of the driving transistor, the second side of the gate electrode of the driving transistor may be the lower side of the gate electrode of the driving transistor. For example, the side of the display substrate used to bind the IC is the lower side of the display substrate, and the lower side of the gate electrode of the driving transistor is the side of the gate electrode of the driving transistor that is closer to the IC. The upper side is the opposite side to the lower side, e.g. the side of the gate electrode of the driving transistor that is further away from the IC.

In the first direction, the gate electrode 204*g* of the fourth transistor T4 and the gate electrode 205*g* of the fifth transistor T5 are both located on the third side of the gate electrode of the driving transistor, the gate electrode 202*g* of the second transistor T2 and the gate electrode 206*g* of the sixth transistor T6 are all located on the fourth side of the gate electrode of the driving transistor. Exemplarily, the third side and the fourth side of the gate electrode of the driving transistor are opposite sides along the first direction; further, the third side of the gate electrode of the driving transistor may be the left side of the gate electrode of the driving transistor, the fourth side of the gate electrode of the driving transistor may be the right side of the gate electrode of the driving transistor.

Embodiments of the present disclosure further provide a display device including the display substrate provided by the above embodiments.

In the display substrate provided by the above embodiment, the orthographic projection of the initialization signal line on the base substrate is located between the orthographic projection of the reset signal line on the base substrate and the orthographic projection of the gate line on the base substrate, so that the distance between the initialization signal line and the first electrode of the first transistor in the sub-pixel to which it belongs and the first electrode of the seventh transistor in the previous sub-pixel adjacent along the second direction are relatively small, so that when the initialization signal line is connected to the first electrode of the first transistor in the sub-pixel to which it belongs through the conductive connection portion 404, and the initialization signal line is connected to the first electrode of the seventh transistor in the previous sub-pixel adjacent along the second direction through the conductive connection portion 404, the size of the conductive connection portion 404 can be effectively reduced, and the shielding area of the conductive connection portion 404 can be reduced. Therefore, the display substrate provided by the above embodiments has good transmittance, and when the display substrate is applied to an under-screen sensor product with transmittance requirements, the sensor product can be guaranteed to have good functionality.

When the display device provided by the embodiment of the present disclosure includes the above-mentioned display substrate, it also has the above-mentioned beneficial effects, which will not be repeated here.

It should be noted that the display device may be any product or component with a display function, such as a TV, a monitor, a digital photo frame, a mobile phone, and a tablet computer.

An embodiment of the present disclosure also provides a method for manufacturing a display substrate, the method includes: forming a plurality of sub-pixels on a base substrate, and the step of forming each sub-pixel specifically includes:

forming a reset signal line, at least a part of the reset signal line extending along the first direction;

forming an initialization signal line, at least a part of the initialization signal line extending along the first direction;

forming a first transistor, the gate electrode of the first transistor is coupled to the reset signal line, the first electrode of the first transistor is coupled to the initialization signal line, and the first electrode of the first transistor is connected to the reset signal line. The orthographic projection of at least part of the first electrode of the first transistor on the base substrate is located between the orthographic projection of the reset signal line on the base substrate and the orthographic projection of the initialization signal line on the base substrate.

In the display substrate manufactured by using the manufacturing method provided by the embodiment of the present disclosure, the orthographic projection of at least a part of the first electrode of the first transistor T1 on the base substrate is located between the orthographic projection of the reset signal line RST on the based substrate and the orthographic projection of the initialization signal line VINT (N) on the base substrate, so that the distance between the initialization signal line VINT(N) and the first electrode of the first transistor T1 in the sub-pixel to which the initialization signal line VINT(N) belongs and the distance between the initialization signal line VINT(N) and the first electrode of the seventh transistor T7 in the previous sub-pixel adjacent along the second direction are both relatively small, so that when the initialization signal line VINT(N) is connected to the first electrode of the first transistor T1 in the sub-pixel to which the initialization signal line VINT(N) belongs through the conductive connection portion 404, and the initialization signal line VINT(N) is connected to the first electrode of the seventh transistor T7 in the previous sub-pixel adjacent along the second direction through the conductive connection portion 404, the size of the conductive connection portion 404 can be effectively reduced. Therefore, in the display substrate provided by the embodiment of the present disclosure, the shielding area of the conductive connection portion 404 is reduced, so that the display substrate has good transmittance, and the display substrate is applied to a under-screen sensor product with transmittance requirements, it can ensure that the sensor product has good functionality. Moreover, in the display substrate provided by the embodiment of the present disclosure, by reducing the size of the conductive connection portion 404, it is more beneficial to avoid crosstalk between the conductive connection portion 404 and other structures around it, thereby effectively improving the stability of the display substrate. In addition, by reducing the size of the conductive connection portion 404, the layout space occupied by the conductive connection portion 404 is reduced, thereby reducing the overall layout difficulty of the display substrate.

It should be noted that each embodiment in the present disclosure is described in a progressive manner, and the same and similar parts between the various embodiments may be referred to each other, and each embodiment focuses on the differences from other embodiments. In particular, as for the method embodiment, since it is basically similar to the product embodiment, the description is relatively simple, and the relevant part can be referred to the part of the description of the product embodiment.

Unless otherwise defined, technical or scientific terms used in this disclosure shall have the ordinary meaning as understood by one of ordinary skill in the art to which this disclosure belongs. As used in this disclosure, "first," "second," and similar terms do not denote any order, quantity, or importance, but are merely used to distinguish the various components. "Include" or "comprise" and similar words mean that the elements or things appearing before the word encompass the elements or things recited after the word and their equivalents, but do not exclude other elements or things. Words like "connected," "coupled" are not limited to physical or mechanical connections, but may include electrical connections, whether direct or indirect. "Up", "Down", "Left", "Right", etc. are only used to represent the relative positional relationship, and when the absolute position of the described object changes, the relative positional relationship may also change accordingly.

It will be understood that when an element such as a layer, film, region or substrate is referred to as being "on" or "under" another element, it can be "directly on" or "under" the other element, or intermediate elements may be present.

In the foregoing description of the embodiments, the particular features, structures, materials or characteristics may be combined in any suitable manner in any one or more of the embodiments or examples.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising: a base substrate and a plurality of sub-pixels arranged on the base substrate; wherein the sub-pixels include:

a reset signal line, at least a part of the reset signal line extending along a first direction;

an initialization signal line, at least a part of the initialization signal line extending along the first direction;

a first transistor, a gate electrode of the first transistor being coupled to the reset signal line, a first electrode of the first transistor being coupled to the initialization signal line, an orthographic projection of at least part of the first electrode of the first transistor on the base substrate being located between an orthographic projection of the reset signal line on the base substrate and an orthographic projection of the initialization signal line on the base substrate.

2. The display substrate according to claim 1, wherein the sub-pixel further comprises a conductive connection portion, and the conductive connection portion is respectively coupled to the first electrode of the first transistor and the initialization signal line, an orthographic projection of the conductive connection portion on the base substrate is located between the orthographic projection of the reset signal line on the base substrate and the orthographic projection of the initialization signal line on the base substrate; a length of the conductive connection portion along a second direction is smaller than a distance between the orthographic projection of the reset signal line on the base substrate and the orthographic projection of the initialization signal line on the base substrate.

3. The display substrate according to claim 2, wherein the orthographic projection of the conductive connection portion on the base substrate does not overlap the orthographic projection of the reset signal line on the base substrate.

4. The display substrate according to claim 2, wherein the orthographic projection of the first electrode of the first transistor on the base substrate partially overlaps the orthographic projection of the initialization signal line on the base substrate.

5. The display substrate according to claim 4, wherein the initialization signal line includes a main body and a protrusion portion, and the main body extends along the first direction, an orthographic projection of the protrusion portion on the base substrate at least partially overlaps the orthographic projection of the first electrode of the first transistor on the base substrate.

6. The display substrate according to claim 1, wherein the sub-pixel further comprises a gate line, at least a part of the gate line extends along the first direction;

the orthographic projection of the initialization signal line on the base substrate is located between the orthographic projection of the reset signal line on the base substrate and an orthographic projection of the gate line on the base substrate.

7. The display substrate according to claim 6, wherein, the sub-pixel further includes a second transistor, a gate electrode of the second transistor is coupled to the gate line, a first electrode of the second transistor is coupled to a second electrode of a driving transistor, and a second electrode of the second transistor is coupled to a gate electrode of the driving transistor.

8. The display substrate according to claim 6, wherein the orthographic projection of the initialization signal line on the base substrate at least partially overlaps an orthographic projection of a gate electrode of a second transistor on the base substrate.

9. The display substrate according to claim 7, wherein the second transistor includes a second active pattern, and the second active pattern includes a conductor portion and two semiconductor portions, the conductor portion is respectively coupled to the two semiconductor portions;

the sub-pixel further includes a shielding pattern, the shielding pattern is coupled to the initialization signal line, and an orthographic projection of the shielding pattern on the base substrate at least partially overlaps an orthographic projection of the conductor portion on the base substrate.

10. The display substrate according to claim 9, wherein the shielding pattern and the initialization signal line are formed as an integrated structure.

11. The display substrate according to claim 9, wherein the shielding pattern includes a first sub-pattern and a second sub-pattern, and the first sub-pattern extends along the second direction, the second direction intersects the first direction, the second sub-pattern extends along the first direction, and an orthographic projection of the second sub-pattern on the base substrate at least partially overlaps the orthographic projection of the conductor portion on the base substrate.

12. The display substrate according to claim 7, wherein the sub-pixel further includes a light-emitting element and a seventh transistor, and a gate electrode of the seventh transistor is coupled to a reset signal line in a next sub-pixel adjacent along the second direction, a first electrode of the seventh transistor is coupled to an initialization signal line in the next sub-pixel adjacent along the second direction, a second electrode of the seventh transistor is coupled to the light-emitting element, and the second direction intersects the first direction;

an orthographic projection of the first electrode of the seventh transistor on the base substrate is located between an orthographic projection of the reset signal line in the next sub-pixel adjacent along the second direction on the base substrate and an orthographic projections of the initialization signal line in the next sub-pixel adjacent along the second direction on the base substrate.

13. The display substrate according to claim 12, wherein the first electrode of the seventh transistor and a first electrode of the first transistor in the next sub-pixel adjacent to the second direction are formed as an integrated structure.

14. The display substrate according to claim 12, wherein the sub-pixel further comprises:

a light-emitting control signal line, at least a part of the light-emitting control signal line extending along the first direction;

a power supply line, at least a part of the power supply line extending along the second direction;

a data line, at least a part of the data line extending along the second direction;

a fourth transistor, wherein a gate electrode of the fourth transistor is coupled to the gate line, a first electrode of the fourth transistor is coupled to the data line, a second electrode of the fourth transistor is coupled to the first electrode of the driving transistor;

a fifth transistor, wherein a gate electrode of the fifth transistor is coupled to the light-emitting control signal line, a first electrode of the fifth transistor is coupled to the power line, a second electrode of the fifth transistor is coupled to the first electrode of the driving transistor;

a sixth transistor, wherein a gate electrode of the sixth transistor is coupled to the light-emitting control signal line, a first electrode of the sixth transistor is coupled to the second electrode of the driving transistor, and a second electrode of the sixth transistor is coupled to the light-emitting element;

a storage capacitor, wherein the gate electrode of the driving transistor is multiplexed as a first electrode plate of the storage capacitor, and a second electrode plate of the storage capacitor is coupled to the power line.

15. A display device comprising the display substrate according to claim 1.

16. The display device according to claim 15, wherein the sub-pixel further comprises a conductive connection portion, and the conductive connection portion is respectively coupled to the first electrode of the first transistor and the initialization signal line, an orthographic projection of the conductive connection portion on the base substrate is located between the orthographic projection of the reset signal line on the base substrate and the orthographic projection of the initialization signal line on the base substrate; a length of the conductive connection portion along the second direction is smaller than a distance between the orthographic projection of the reset signal line on the base substrate and the orthographic projection of the initialization signal line on the base substrate.

17. The display device according to claim 16, wherein the orthographic projection of the conductive connection portion on the base substrate does not overlap the orthographic projection of the reset signal line on the base substrate.

18. The display device according to claim 16, wherein the orthographic projection of the first electrode of the first transistor on the base substrate partially overlaps the orthographic projection of the initialization signal line on the base substrate.

19. The display device according to claim 18, wherein the initialization signal line includes a main body and a protrusion portion, and the main body extends along the first direction, an orthographic projection of the protrusion portion on the base substrate at least partially overlaps the orthographic projection of the first electrode of the first transistor on the base substrate.

20. The display device according to claim 15, wherein the sub-pixel further comprises a gate line, at least a part of the gate line extends along the first direction;

the orthographic projection of the initialization signal line on the base substrate is located between the orthographic projection of the reset signal line on the base substrate and an orthographic projection of the gate line on the base substrate.

* * * * *